(12) United States Patent
Sinitsky et al.

(10) Patent No.: US 9,178,497 B2
(45) Date of Patent: *Nov. 3, 2015

(54) PRECISION OSCILLATOR WITH TEMPERATURE COMPENSATION

(71) Applicant: Marvell World Trade Ltd., St. Michael (BB)

(72) Inventors: Dennis Sinitsky, Sunnyvale, CA (US); Tao Shui, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/218,256

(22) Filed: Mar. 18, 2014

(65) Prior Publication Data

US 2014/0197897 A1     Jul. 17, 2014

Related U.S. Application Data

(63) Continuation of application No. 13/350,229, filed on Jan. 13, 2012, now Pat. No. 8,692,625.

(60) Provisional application No. 61/434,292, filed on Jan. 19, 2011.

(51) Int. Cl.
| | |
|---|---|
| *H03K 3/0231* | (2006.01) |
| *H03K 3/02* | (2006.01) |
| *H03K 3/011* | (2006.01) |
| *H03K 4/502* | (2006.01) |
| *H03L 1/00* | (2006.01) |
| *H03L 1/02* | (2006.01) |

(52) U.S. Cl.
CPC ............... *H03K 3/02* (2013.01); *H03K 3/011* (2013.01); *H03K 3/0231* (2013.01); *H03K 4/502* (2013.01); *H03L 1/00* (2013.01); *H03L 1/02* (2013.01)

(58) Field of Classification Search
CPC ................. H03K 3/0231; H03K 4/50–4/502
USPC .................................................. 331/111, 143
See application file for complete search history.

(56) References Cited

U.S. PATENT DOCUMENTS

| 7,474,163 | B1 | 1/2009 | Wile et al. | |
|---|---|---|---|---|
| 8,692,625 | B2 * | 4/2014 | Sinitsky et al. | ............... 331/143 |

(Continued)

FOREIGN PATENT DOCUMENTS

WO     WO 2010/033079 A1     3/2010

OTHER PUBLICATIONS

Notification of Transmittal, International Search Report, and Written Opinion of the International Searching Authority, mailed Apr. 3, 2012 in International Application No. PCT/US2012/021261.

*Primary Examiner* — Ryan Johnson

(57) ABSTRACT

New and highly stable oscillators are disclosed. Such an oscillator may include a first capacitor electrically connected to a first charging switch and a first discharging switch, a second capacitor electrically connected to a second charging switch and a second discharging switch, a first chopping circuit having a first input electrically connected to the first capacitor and a second input electrically connected to a reference voltage, a second chopping circuit having a first input electrically connected to the second capacitor and a second input electrically connected to the reference voltage, a first comparator having a first input electrically connected to a first and second output of the first chopping circuit, a second comparator having a first input electrically connected to a first and second output of the second chopping circuit, and control circuitry having a first input electrically coupled to an output of the first comparator and a second input electrically connected to an output of the second comparator.

15 Claims, 5 Drawing Sheets

(56) References Cited

U.S. PATENT DOCUMENTS

| | | | |
|---|---|---|---|
| 2006/0181360 A1* | 8/2006 | Mirow | ................... 331/144 |
| 2007/0103244 A1 | 5/2007 | D'Abramo et al. | |
| 2010/0090772 A1 | 4/2010 | Hu et al. | |
| 2012/0126906 A1 | 5/2012 | Choe et al. | |

* cited by examiner

-- PRIOR ART --

FIG. 2 -- PRIOR ART --

PRECISION OSCILLATOR WITH TEMPERATURE COMPENSATION

INCORPORATION BY REFERENCE

This application is a continuation of U.S. application Ser. No. 13/350,229, filed on Jan. 13, 2012, which claims priority under 35 U.S.C. §119(e) to U.S. Provisional Application 61/434,292, filed on Jan. 19, 2011. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Oscillators are used in almost every modern electronic device and come in a large variety of configurations. Unfortunately, the performance of all of these oscillators is susceptible to a variety of factors, such as aging and environmental conditions, which cause the oscillators to drift in frequency. Unfortunately, compensating for such factors can add substantial expense for minimal performance gains. Accordingly, new approaches to oscillator compensation may be desirable.

SUMMARY

Various aspects and embodiments of the invention are described in further detail below.

In an embodiment, an oscillator comprises a first capacitor electrically connected to a first charging switch and a first discharging switch, a second capacitor electrically connected to a second charging switch and a second discharging switch, a first chopping circuit having a first input electrically connected to the first capacitor and a second input electrically connected to a reference voltage, a second chopping circuit having a first input electrically connected to the second capacitor and a second input electrically connected to the reference voltage, a first comparator having a first input and second input electrically connected to a first and second output of the first chopping circuit, a second comparator having a first input and second input electrically connected to a first and second output of the second chopping circuit, and control circuitry having a first input electrically coupled to an output of the first comparator and a second input electrically connected to an output of the second comparator.

In another embodiment, an oscillator comprises a first comparator and a second comparator, compensation circuitry electrically connected to the first comparator and the second comparator, the compensation circuitry configured to compensate for a difference in respective input offset voltages of the first comparator and the second comparator, and control circuitry electrically coupled to the first comparator and the second comparator, the control circuitry configured to control oscillation of the oscillator.

In yet another embodiment, an oscillator comprises a first capacitor electrically connected to a first charging switch and a first discharging switch; a second capacitor electrically connected to a second charging switch and a second discharging switch; a first comparator and a second comparator; and compensation means electrically connected to the first capacitor, the second capacitor, the first comparator and the second comparator, the compensation means for compensating for a difference in respective input offset voltages of the first comparator and the second comparator; and control means electrically coupled to the first comparator and the second comparator for controlling the charging switches and discharging switches.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

The disclosed methods and systems below may be described generally, as well as in terms of specific examples and/or specific embodiments. For instances where references are made to detailed examples and/or embodiments, it is noted that any of the underlying principles described are not to be limited to a single embodiment, but may be expanded for use with any of the other methods and systems described herein as will be understood by one of ordinary skill in the art unless otherwise stated specifically.

Figure 1:
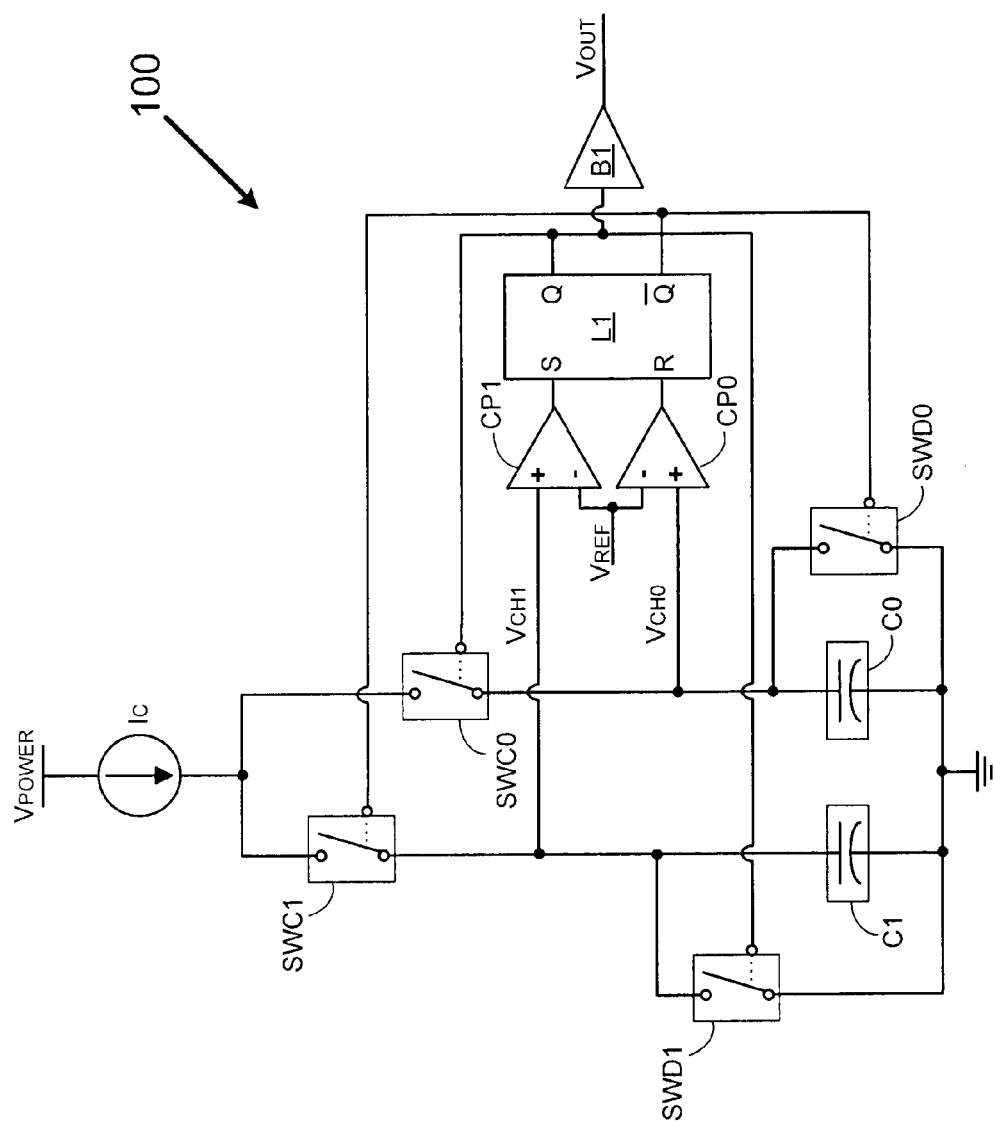
FIG. 1 is an example of a known oscillator.

FIG. 1 is an example of a known oscillator 100. The oscillator 100 includes a constant current source $I_C$, a first charging switch SWC1, a second charging switch SWC0, a first discharging switch SWD1, a second discharging switch SWD0, a first capacitor C1, a second capacitor C0, a first comparator CP1, a second comparator CP0, an SR-latch L1, and a buffer B1.

In operation, the latch L1, which acts as control circuitry for the oscillator 100, causes the various switches {SWC1, SWC0, SWD1, SWD0} to open and close in a controlled fashion thus charging and discharging capacitors C1 and C0 in an alternating manner as will be shown below with respect to FIG. 2. Since C1 and C0 can be chosen as well-controlled temperature-independent metal-insulator-metal capacitors, it is advantageous for C1 and C0 to be much larger than other parasitic capacitances at the inputs of the comparators CP1 and CP0, because the parasitic capacitances are hard to control and vary with temperature. This, in turn, limits the size of the input stages of comparators CP1/CP0 and therefore results in a large input-referred offset of said comparators.

As the capacitors C1 and C0 alternatively charge and discharge, saw-tooth waveforms are produced (voltages $V_{CH1}$ and $V_{CH0}$), which are fed to inputs of comparators CP1 and CP0 to allow each the voltages $V_{CH1}$ and $V_{CH0}$ to be respectively compared to a reference voltage $V_{REF}$. The output signals of the comparators CP1 and CP0 are then fed to respective inputs to the latch L1, which in turn changes state to provide feedback control to the switches {SWC1, SWC0, SWD1, SWD0}.

Figure 2:
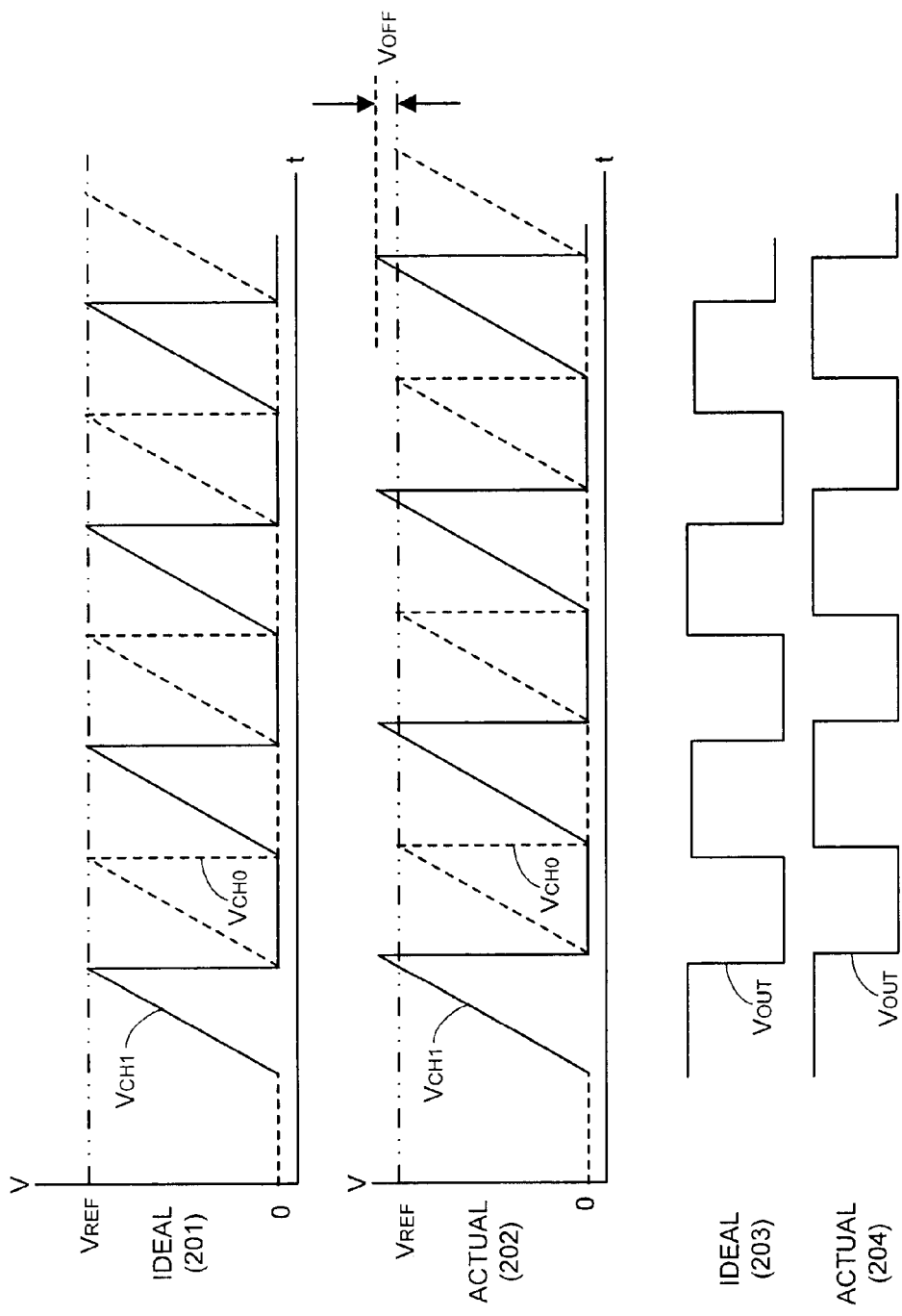
FIG. 2 depicts various ideal and non-ideal waveforms produced by the oscillator of FIG. 1.

FIG. 2 depicts various ideal and non-ideal waveforms {201, 202, 203, 204} produced by the oscillator of FIG. 1.

Turning first to ideal waveform 201, assuming that the capacitances of capacitors C1 and C0 are equal, the ideal voltage pattern for voltages $V_{CH1}$ and $V_{CH0}$ will be identical saw-tooth patterns displaced in time/phase by 180°. Note that, in the ideal case, the waveforms of voltages $V_{CH1}$ and $V_{CH0}$ will oscillate between zero volts and the reference voltage $V_{REF}$. This is because as the respective comparators CP1 and CP0 change output state (e.g., when $V_{CH1} \geq V_{REF}$), the state of the outputs of latch L1 will change, which in turn will change the on/off positions of the switches {SWC1, SWC0, SWD1, SWD0}. The output of the buffer B1 for the ideal case is depicted by waveform 203.

Now turning to a non-ideal (actual, real-world) scenario, it is to be appreciated that real-world comparators have an input-offset voltage (typically represented by the symbol "$V_{OS}$") between their inputs. It is also to be appreciated that two different comparators can have different input-offset voltages, which for the purpose of this disclosure is represented by the symbol "$V_{OFF}$." This offset difference $V_{OFF}$, which can change over time or over varying operating conditions, such as temperature, can affect the output frequency/periodicity of the oscillator 100. As shown in waveform 202, the exemplary offset $V_{OFF}$ causes amplitude and relative duration waveform differences in voltages $V_{CH1}$ and $V_{CH0}$. The output of the buffer B1 for the non-ideal case is depicted by waveform 204, and can be easily contrasted with waveform 203.

Figure 3:
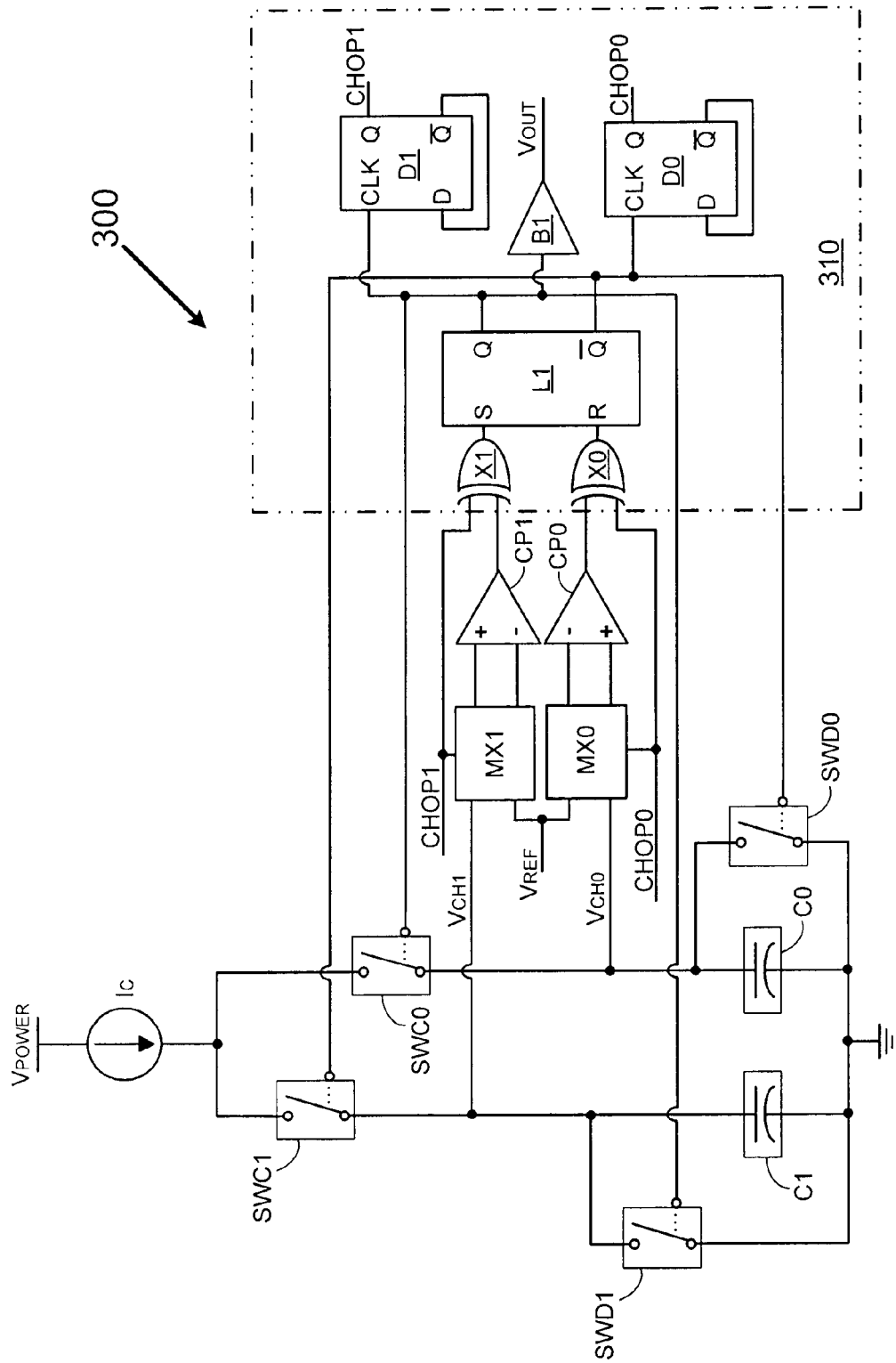
FIG. 3 is an example oscillator modified to compensate for non-ideal components.

FIG. 3 is an example oscillator 300 modified to compensate for non-ideal components, such as the varying input-offset voltages discussed with respect to FIGS. 1 and 2. As with the oscillator 100 of FIG. 1, the modified oscillator 300 includes a constant current source $I_C$, a first charging switch SWC1, a second charging switch SWC0, a first discharging switch SWD1, a second discharging switch SWD0, a first capacitor C1, a second capacitor C0, a first comparator CP1, a second comparator CP0, an SR-latch L1, and a buffer B1. However, the modified oscillator also includes a first chopper MX1 and a second chopper MX0, and the control circuitry 310 is expanded from latch L1 to further include a first exclusive-or ("XOR") gate X1, a second XOR gate X0, a first flip-flop D1 and a second flip-flop D0.

In operation, the control circuitry 310 (via latch L1) causes the various switches {SWC1, SWC0, SWD1, SWD0} to open and close in a controlled fashion thus charging and discharging capacitors C1 and C0 in an alternating manner, with the resultant waveforms respectively fed to a respective first input to choppers MX1 and MX0. The reference voltage $V_{REF}$ is fed to a second input of each chopper MX1 and MX0.

The outputs of each chopper MX1 and MX0 will change depending on the state of control signals CHOP1 and CHOP0 respectively produced by flip-flops D1 and D0. For example, for CHOP1=HIGH MX1 will pass voltage $V_{CH1}$ to the positive (+) input of comparator CP1 and the reference voltage $V_{REF}$ to the negative input (−) of comparator CP1, while for CHOP1=LOW, MX1 will pass voltage $V_{CH1}$ to the negative input of comparator CP1 and the reference voltage $V_{REF}$ to the positive input of comparator CP1. Chopper MX0 acts in a similar fashion.

The output signals of the comparators CP1 and CP0 are then fed to their respective exclusive-or gates X1 and X0, which in turn are logically combined with the CHOP1 and CHOP0 signals. The outputs of gates X1 and X0 are fed to respective inputs of latch L1, which in turn changes state to provide feedback control to the switches {SWC1, SWC0, SWD1, SWD0}.

Additionally, as the clock input of flip-flop D1 is electrically connected to the positive output of the latch L1, the state of control signal CHOP1 will change every time the positive output of the latch L1 transitions from low to high. Similarly, as the clock input of flip-flop D0 is electrically connected to the negative output of the latch L1, the state of control signal CHOP0 will change every time the negative output of the latch L1 transitions from low to high. The changing states of control signals CHOP1 and CHOP0 are fed back to control ports of the choppers MX1 and MX0 and to inputs of gates X1 and X0, thus causing the choppers MX1 and MX0 and gates X1 and X0 to change operation in a deterministic fashion.

Figure 4:
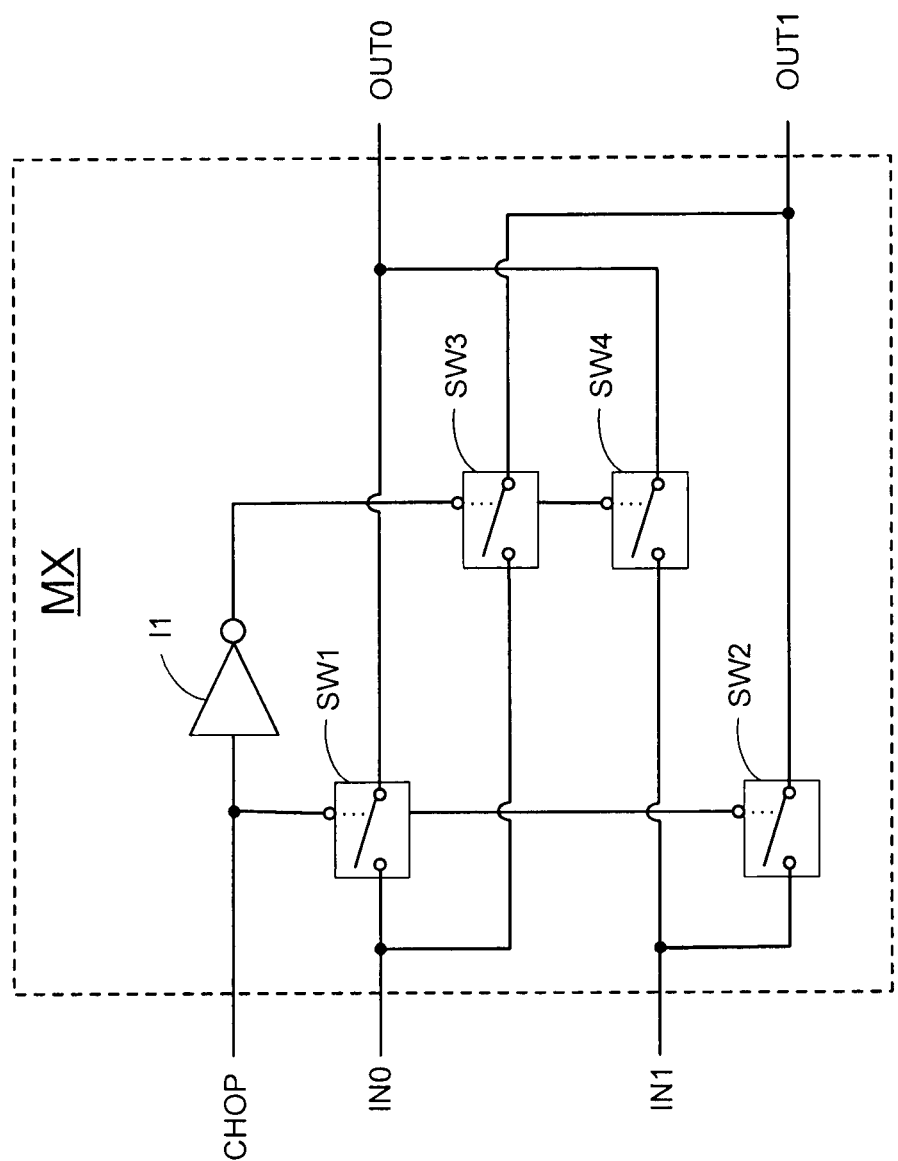
FIG. 4 depicts an example of a chopping circuit used in the oscillator of FIG. 3.

FIG. 4 depicts an example of a chopping circuit MX used in the oscillator of FIG. 3. As shown in FIG. 4, the chopping circuit MX includes an inverter I1 and four switches SW1, SW2, SW3 and SW4. The theory and operation of such chopping circuitry (also called chopping circuitry or choppers) are well known with respect to analog-to-digital conversion devices. When control signal CHOP is HIGH, input IN0 is connected/coupled to output OUT0 and input IN1 is connected/coupled to output OUT1. When control signal CHOP is LOW, however, input IN0 is connected/coupled to output OUT1 and input IN1 is connected/coupled to output OUT0.

Figure 5:
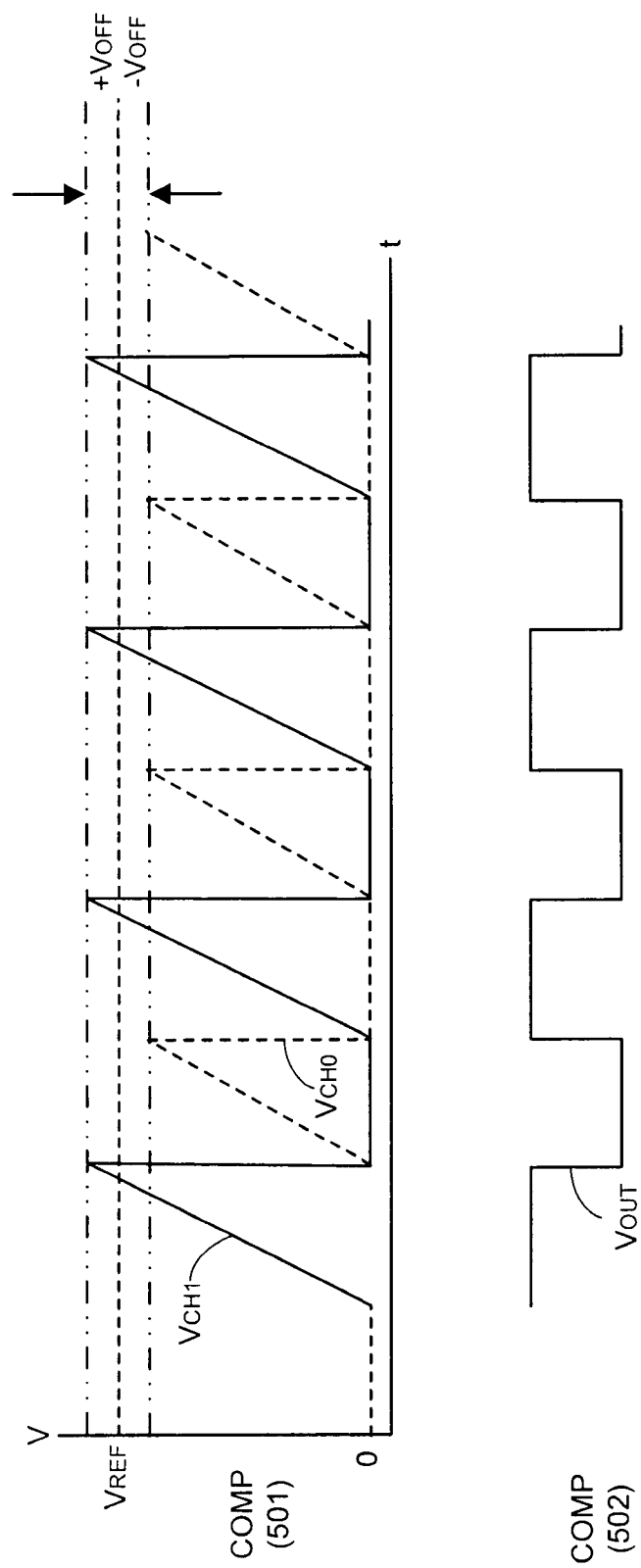
FIG. 5 depicts the waveforms produced by the modified oscillator of FIG. 3.

FIG. 5 depicts waveforms {501, 502} produced by the modified oscillator 300 of FIG. 3. As shown in waveform 501, the difference offset $V_{OFF}$ is still present and affects the oscillator 300, but the overall effect upon voltages $V_{CH1}$ and $V_{CH0}$ is different. That is, a varying $V_{OFF}$ now causes complementary changes in $V_{CH1}$ and $V_{CH0}$). While the resultant output $V_{OUT}$ of buffer B1 (shown in waveform 502) does not produce a perfect square wave, frequency/periodicity variance due to component differences is reduced or eliminated. Another advantage is that long-term influence of 1/f noise inherent in the comparators CP1 and CP0 is reduced or removed. It is to be appreciated that if the oscillator 300 is run at 2× speed, a divide-by-2 circuit, such as a D-flop, may be used to produce a more suitable square-wave output.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A method of controlling an oscillator, comprising:
   comparing a first voltage and a reference voltage in a first comparator to determine a first input offset voltage;
   comparing a second voltage with the reference voltage in a second comparator to determine a second input offset voltage;
   compensating for a difference between the first input offset voltage of the first comparator and second input offset voltage of the second comparator by connecting a first input of the first comparator to the first voltage and a second input of the first comparator to the reference voltage when a control signal is at a first state, and connecting the first input of the first comparator to the reference voltage and the second input of the first comparator to the first voltage when the control signal is in a second state;
   controlling an oscillation of the oscillator based on the compensated differences in the respective first and second input offset voltages by control circuitry having one or more logic gates receiving output signals from the two comparators;
   performing an exclusive-or (XOR) operation between an output of the first comparator and the control signal by a first XOR gate of the one or more logic gates, the first XOR gate having inputs electrically connected to the output of the first comparator and the control signal; and performing another XOR operation between an output of the second comparator and a second control signal by a second XOR gate of the one or more logic gates, the second XOR gate having inputs electrically connected to the output of the second comparator and the second control signal.

2. A method of claim 1, comprising:

compensating for a difference between the first input offset voltage of the first comparator and second input offset voltage of the second comparator by connecting a first input of the second comparator to the first voltage and a second input of the second comparator to the reference voltage when the second control signal is at the first state, and connecting the first input of the second comparator to the reference voltage and the second input of the second comparator to the first voltage when the second control signal is in the second state.

3. A method of claim 1, comprising:

creating the control signal based on output signals from the first and second comparators.

4. A method of claim 2, comprising:

creating the second control signal based on output signals from the first and second comparators.

5. An oscillator, comprising:

a capacitor circuit;

a first circuit having a first input electrically connected to the capacitor circuit and a second input electrically connected to a reference voltage, the first circuit including a switching network that connects its first input to its first output and its second input to its second output when a control signal is at a first state, and connects its first input to its second output and its second input to its first output when the control signal is at a second state;

a second circuit having a first input electrically connected to the capacitor circuit and a second input electrically connected to the reference voltage;

a first comparator having a first input and second input electrically connected to the first output and second output of the first circuit;

a second comparator having a first input and second input electrically connected to a first output and second output of the second circuit; and control circuitry having one or more logic gates receiving output signals from the two comparators, the one or more logic gates including:

a first exclusive-or (XOR) gate having inputs electrically connected to an output of the first comparator and the control signal; and a second XOR gate electrically having inputs electrically connected to an output of the second comparator and a second control signal.

6. The oscillator of claim 5, wherein the second circuit further comprises a switching network that:

connects its first input to its first output and its second input to its second output when the second control signal is at a first state; and connects its first input to its second output and its second input to its first output when the second control signal is at the second state.

7. The oscillator of claim 6, wherein the control circuitry comprises a latch receiving output signals from the one or more logic gates.

8. The oscillator of claim 7, wherein the control circuitry further comprises:

a first flip-flop electrically connected to a positive output of the latch and configured to create the control signal that controls the first circuit; and a second flip-flop electrically connected to a negative output of the latch and configured to create the second control signal that controls the second circuit.

9. The oscillator of claim 7, wherein a positive output of the latch controls a second charging switch and a first discharging switch.

10. The oscillator of claim 7, wherein a negative output of the latch controls a first charging switch and a second discharging switch.

11. The oscillator of claim 5, wherein the capacitor circuit has an impedance substantially lower than input impedances of the first and second comparators.

12. An oscillator, comprising:

a first comparator and a second comparator;

compensation circuitry electrically connected to the first comparator and the second comparator, the compensation circuitry configured to compensate for a difference in respective input offset voltages of the first comparator and the second comparator, the compensation circuitry including a plurality of choppers receiving respective control signals, the choppers connecting a first input to a first output and a second input to a second output when the control signal is at a first state, and connecting the first input to the second output and the second input to the first output when the control signal is in a second state; and a circuit configured to control oscillation of the oscillator that is coupled to the first comparator and the second comparator, the circuit having one or more logic gates receiving output signals from the two comparators, the one or more logic gates including:

a first exclusive-or (XOR) gate having inputs electrically connected to an output of the first comparator and the control signal; and a second XOR gate electrically having inputs electrically connected to an output of the second comparator and a second control signal.

13. The oscillator of claim 12, wherein the circuit is also configured to control the compensation circuitry.

14. The oscillator of claim 13, wherein the compensation circuitry is also coupled to capacitive circuitry and a plurality of switches.

15. The oscillator of claim 14, wherein the circuit is also coupled to the plurality of switches.

* * * * *